United States Patent
You

(10) Patent No.: US 8,569,760 B2
(45) Date of Patent: Oct. 29, 2013

(54) THIN FILM TRANSISTOR HAVING OXIDE SEMICONDUCTOR LAYER AS OHMIC CONTACT LAYER AND METHOD OF FABRICATING THE SAME

(75) Inventor: Chun-Gi You, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 345 days.

(21) Appl. No.: 12/926,114

(22) Filed: Oct. 27, 2010

(65) Prior Publication Data

US 2011/0127520 A1    Jun. 2, 2011

(30) Foreign Application Priority Data

Nov. 30, 2009    (KR) .................. 10-2009-0117076

(51) Int. Cl.
*H01L 21/02*    (2006.01)
(52) U.S. Cl.
USPC    257/59; 257/62; 257/E21.496; 257/E29.273; 257/E29.296
(58) Field of Classification Search
USPC ................. 257/57–62, E21.496, 29.273, 296
See application file for complete search history.

(56) References Cited

U.S. PATENT DOCUMENTS

| | | | | |
|---|---|---|---|---|
| 5,614,728 | A * | 3/1997 | Akiyama | 257/57 |
| 8,338,226 | B2 * | 12/2012 | Asano et al. | 438/104 |
| 8,362,563 | B2 * | 1/2013 | Kondo et al. | 257/352 |
| 2008/0258143 | A1 * | 10/2008 | Kim et al. | 257/43 |
| 2009/0020745 | A1 | 1/2009 | Jeong et al. | |
| 2010/0155721 | A1 * | 6/2010 | Lee et al. | 257/43 |
| 2011/0124152 | A1 * | 5/2011 | Ahn et al. | 438/104 |

FOREIGN PATENT DOCUMENTS

| | | | |
|---|---|---|---|
| JP | 3482073 | B2 | 1/1998 |
| JP | 3356748 | B2 | 7/2001 |
| JP | 2007-073558 | * | 3/2007 |
| JP | 2007-073563 | * | 3/2007 |
| KR | 10 2007-0080476 A | | 8/2007 |
| KR | 10 2008-0093709 A | | 10/2008 |
| KR | 10 2009-0009564 A | | 1/2009 |

\* cited by examiner

*Primary Examiner* — Michael Lebentritt
(74) *Attorney, Agent, or Firm* — Lee & Morse, P.C.

(57) ABSTRACT

A thin film transistor TFT, including a substrate, a gate electrode on the substrate, a gate insulating layer on the gate electrode, an active layer on the gate insulating layer, the active layer corresponding to the gate electrode and including a channel region, source and drain electrodes contacting the active layer, the source and drain electrodes being separate from each other, and an ohmic contact layer between the active layer and at least one of the source and drain electrodes, the ohmic contact layer including an oxide semiconductor material.

13 Claims, 5 Drawing Sheets

THIN FILM TRANSISTOR HAVING OXIDE SEMICONDUCTOR LAYER AS OHMIC CONTACT LAYER AND METHOD OF FABRICATING THE SAME

BACKGROUND

1. Field

Embodiments relate to a' TFT having an oxide semiconductor layer as an ohmic contact layer, and a method of fabricating the TFT.

2. Description of the Related Art

In display apparatuses such as organic light-emitting diode (OLED) display apparatuses or liquid crystal displays (LCD), thin film transistors (TFTs) are widely used as devices that switch and/or drive a display device.

Examples of a TFT used for switching or driving devices are an amorphous silicon TFT (a-Si TFT) that uses an amorphous silicon layer as a semiconductor layer and a polysilicon TFT (poly-Si TFT) that uses a polysilicon layer. The a-Si TFT may be manufactured using a low temperature process, and thus a large-size substrate may be manufactured at low cost. However, the a-Si TFT may have poor electric characteristics and reliability due to low mobility. The poly-Si TFT may have improved device characteristics and reliability due to high mobility, but when the polysilicon layer is formed by using a crystallization method in which a laser is used, the manufacturing processes may become complicated and manufacturing costs may be increased.

SUMMARY

Embodiments are directed to a thin film transistor (TFT) in which an oxide semiconductor layer is used as an ohmic contact layer, and a method of fabricating the TFT, which substantially overcome one or more problems due to the limitations and disadvantages of the related art.

It is therefore a feature of an embodiment to provide a TFT and a method of fabricating the TFT, the TFT including an oxide semiconductor layer used as an ohmic contact layer.

It is therefore another feature of an embodiment to provide a semiconductor device having an ohmic contact layer interposed between a semiconductor material and a metal material, the ohmic contact layer including an oxide semiconductor material.

At least one of the above and other features and advantages may be realized by providing a thin film transistor, including a substrate, a gate electrode on the substrate, a gate insulating layer on the gate electrode, an active layer on the gate insulating layer, the active layer corresponding to the gate electrode and including a channel region, source and drain electrodes contacting the active layer, the source and drain electrodes being separate from each other, and an ohmic contact layer between the active layer and at least one of the source and drain electrodes, the ohmic contact layer including an oxide semiconductor material.

The oxide semiconductor material may include at least one of In, Ga, Zn, Sn, Sb, Ge, Hf, and As.

The oxide semiconductor material may include at least one of ZnO, $SnO_2$, $In_2O_3$, $Zn_2SnO_4$, $Ga_2O_3$, and $HfO_2$.

The source and drain electrodes may include at least one of Au, Pd, Pt, Ni, Rh, Ru, Ir, Os, Al, Mo, an Al:Nd alloy, and a MoW alloy.

The active layer may include polysilicon.

The thin film transistor may further include a channel stopper layer corresponding to the channel region, the channel region being between the channel stopper layer and the gate electrode.

The channel stopper layer may include a nitride.

At least one of the above and other features and advantages may also be realized by providing a semiconductor device, including an ohmic contact layer interposed between a semiconductor material and a metal material, wherein the ohmic contact layer comprises an oxide semiconductor material.

The oxide semiconductor material may include at least one of In, Ga, Zn, Sn, Sb, Ge, Hf, and As.

The oxide semiconductor material may include at least one of ZnO, $SnO_2$, $In_2O_3$, $Zn_2SnO_4$, $Ga_2O_3$, and $HfO_2$.

The semiconductor material may include polysilicon.

At least one of the above and other features and advantages may also be realized by providing a method of fabricating a thin film transistor, the method including forming a gate electrode on a substrate, forming a gate insulating layer on the gate electrode, forming an active layer on the gate insulating layer, the active layer corresponding to the gate electrode and including a channel region, forming source and drain electrodes contacting the active layer, the source and drain electrodes being separate from each other, and forming an ohmic contact layer, the ohmic contact layer being disposed between the active layer and at least one of the source and drain electrodes, the ohmic contact layer including an oxide semiconductor material.

Forming the ohmic contact layer may include depositing the oxide semiconductor material on the active layer using a sputtering method.

The oxide semiconductor material may include at least one of In, Ga, Zn, Sn, Sb, Ge, Hf, and As.

The oxide semiconductor layer may include at least one of ZnO, $SnO_2$, $In_2O_3$, $Zn_2SnO_4$, $Ga_2O_3$, and $HfO_2$.

The active layer may include polysilicon.

Forming the active layer may include using a low temperature poly-Si (LTPS) process.

The method may further include forming a channel stopper layer corresponding to the channel region, such that the channel region is between the channel stopper layer and the gate electrode.

The channel stopper layer may include a nitride.

BRIEF DESCRIPTION OF THE DRAWINGS

The above and other features and advantages will become more apparent to those of skill in the art by describing in detail exemplary embodiments with reference to the attached drawings, in which.

DETAILED DESCRIPTION

Figure 1:
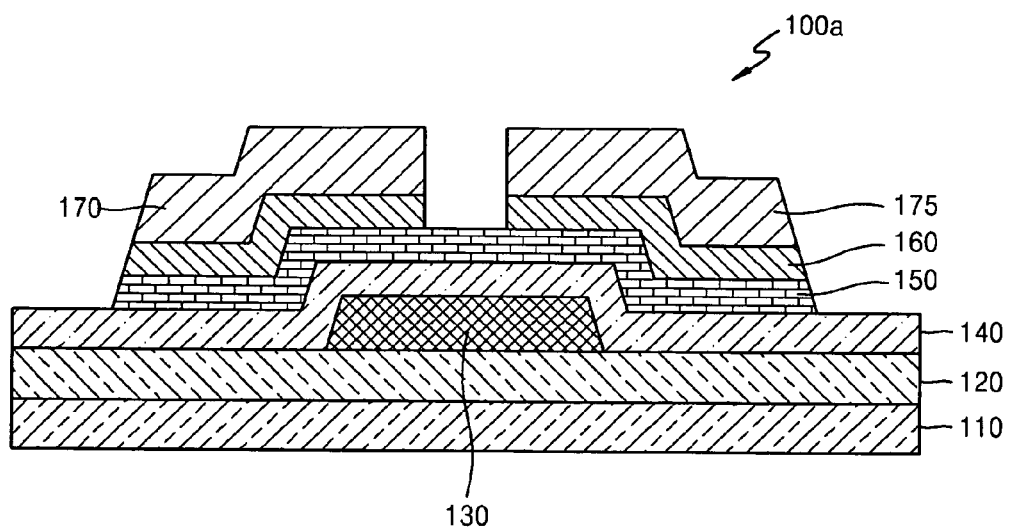
FIG. 1 illustrates a cross-sectional view of a thin film transistor TFT according to a first example embodiment.

Korean Patent Application No. 10-2009-0117076, filed on Nov. 30, 2009, in the Korean Intellectual Property Office, and entitled: "Thin Film Transistor Having Oxide Semiconductor Layer as Ohmic Contact Layer and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a thin film transistor TFT 100a according to a first example embodiment.

Referring to FIG. 1, a buffer layer 120 may be formed on a substrate 110. The buffer layer 120 may prevent penetration of impurities into the substrate 110 or into layers that are disposed on the substrate 110. The buffer layer 120 may include, e.g., $SiO_2$ and/or silicon nitride ($SiN_x$, where $x \geq 1$).

The substrate 110 may be formed of a transparent glass, which may contain $SiO_2$ as a main component. In another implementation, the substrate 110 may be formed of a plastic material. The plastic material may include one or more organic materials such as polyethersulphone (PES), polyacrylate (PAR), polyetherimide (PEI), polyethyelene naphthalate (PEN), polyethyelene terephthalate (PET), polyphenylene sulfide (PPS), polyallylate, polyimide, polycarbonate (PC), triacetate cellulose (TAC), cellulose acetate propionate (CAP), etc. In another implementation, the substrate 110 may include a metal foil or a flexible substrate. For example, the substrate 110 may include one or more of carbon (C), iron (Fe), chromium (Cr), manganese (Mg), nickel (Ni), titanium (Ti), molybdenum (Mo), stainless steel (SUS), Invar alloys, Inconel alloys, Kovar alloys, etc.

A gate electrode 130 may be formed on a portion of the buffer layer 120.

The gate electrode 130 may be formed of a metal or a metal alloy such as Au, Ag, Cu, Ni, Pt, Pd, Al, Mo, or an Al:Nd alloy, a Mo:W alloy, etc. In other implementations, the material(s) for the gate electrode 130 may be selected in consideration of adhesion properties to adjacent layers, planarization characteristics of layers being stacked, electric resistance, processability, etc.

A gate insulating layer 140 may be formed on the gate electrode 130. The gate insulating layer 140 may be formed on the gate electrode 130 and on the buffer layer 120. The gate insulating layer 140 may include an inorganic material such as $SiN_x$ or $SiO_2$. In another implementation, the gate insulating layer 140 may include an organic insulating material.

An active layer 150 may be formed on the gate insulating layer 140 to correspond to the gate electrode 130. The active layer 150 may include a channel region that overlaps with the gate electrode 130. The active layer 150 may include a silicon material such as amorphous silicon or polysilicon. In another implementation, the active layer 150 may include an organic semiconductor material.

Source and drain electrodes 170 and 175 may be formed on the active layer 150. The source and drain electrodes 170 and 175 may be formed on the active layer 150 and on and the gate insulating layer 140. Each of the source and drain electrodes 170 and 175 may contact a respective end of the active layer 150, i.e., may contact respective source and drain regions of the active layer 150. The source and drain electrodes 170 and 175 may include one or more metals or metal materials, e.g., Au, Pd, Pt, Ni, Rh, Ru, Ir, Os, Al, Mo, an Al:Nd alloy, a W-containing electrode material such as a MoW alloy, etc.

An ohmic contact layer 160 may be disposed between the source electrode 170 and the active layer 150 and/or between the drain electrode 175 and the active layer 150. The ohmic contact layer 160 may include an oxide semiconductor layer.

The ohmic contact layer 160 may include an oxide semiconductor layer that includes one or more of the following elements: In, Ga, Zn, Sn, Sb, Ge, Hf, and As. For example, the ohmic contact layer 160 may include one or more of ZnO, $SnO_2$, $In_2O_3$, $Zn_2SnO_4$, $Ga_2O_3$, and $HfO_2$, in the oxide semiconductor layer. The ohmic contact layer 160 may provide ohmic contacts where the source and drain electrodes 170 and 175 contact the active layer 150. The oxide semiconductor material may directly contact the active layer 150. The oxide semiconductor material may directly contact the source and drain electrodes 170 and 175.

Figure 2A:
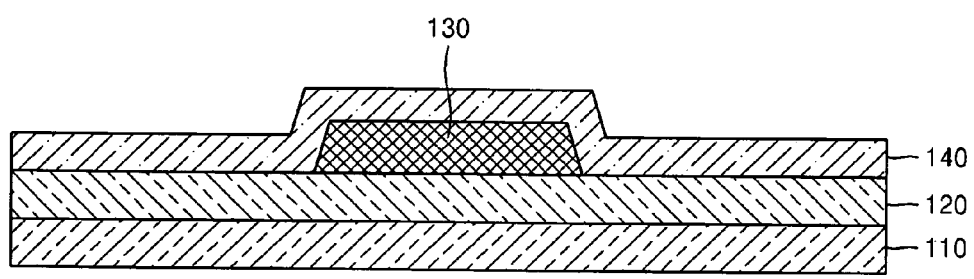
FIGS. 2A and 2B illustrate cross-sectional views of stages in a method of fabricating the TFT of FIG. 1.
Figure 2B:
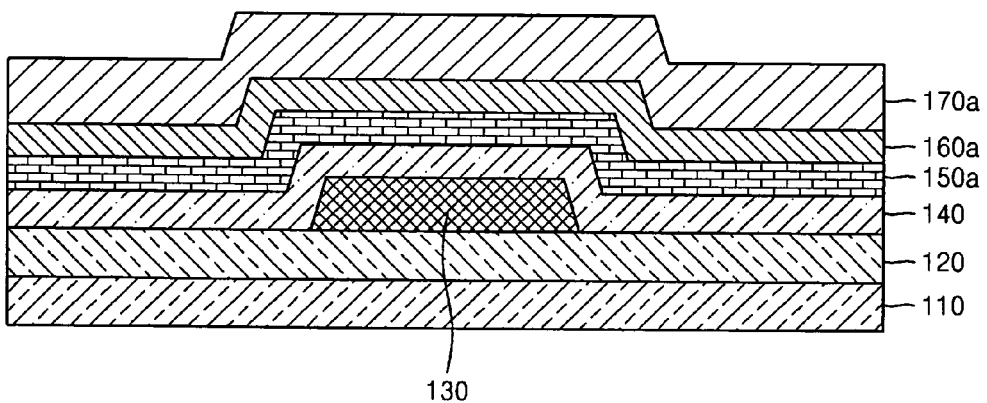

FIGS. 2A and 2B illustrate cross-sectional views of stages in a method of fabricating the TFT 100a of FIG. 1.

Referring to FIG. 2A, the buffer layer 120 may be formed on the substrate 110. The gate electrode 130 may be formed on a portion of the buffer layer 120 by, e.g., depositing a gate electrode material on the buffer layer 120 and then patterning the same. The gate insulating layer 140 may be formed on the gate electrode 130 and on the buffer layer 120.

Referring to FIG. 2B, a polysilicon layer 150a (for forming the active layer 150 of FIG. 1) may be formed on the gate insulating layer 140. The polysilicon layer 150a may be formed by, e.g., depositing an amorphous silicon material on the gate insulating layer 140 and crystallizing the amorphous silicon material by using a low temperature poly-Si (LTPS) process.

Next, an oxide semiconductor layer 160a (for forming the ohmic contact layer 160 of FIG. 1) may be formed on the polysilicon layer 150a. An electrode material layer 170a (for forming source and drain electrodes 170 and 175), e.g., a metal layer, may be deposited on the oxide semiconductor layer 160a.

The oxide semiconductor layer 160a may include the oxide semiconductor material, which may include one or more of In, Ga, Zn, Sn, Sb, Ge, Hf, and As. For example, the oxide semiconductor layer 160a may include one or more of ZnO, $SnO_2$, $In_2O_3$, $Zn_2SnO_4$, $Ga_2O_3$, and $HfO_2$.

The oxide semiconductor layer 160a may be formed by, e.g., using a physical deposition method such as a sputtering method. The oxide semiconductor layer 160a may be formed while controlling an amount of oxygen flow during formation thereof, taking into account a desired resistance value for the ohmic contact layer.

Next, the active layer 150, the ohmic contact layer 160, and the source and drain electrodes 170 and 175 may be formed as illustrated in FIG. 1 by etching the electrode material layer 170a, the oxide semiconductor layer 160a, and the polysilicon layer 150a. The etching process may be performed in a single process by using a half-tone mask (not shown).

Figure 3:
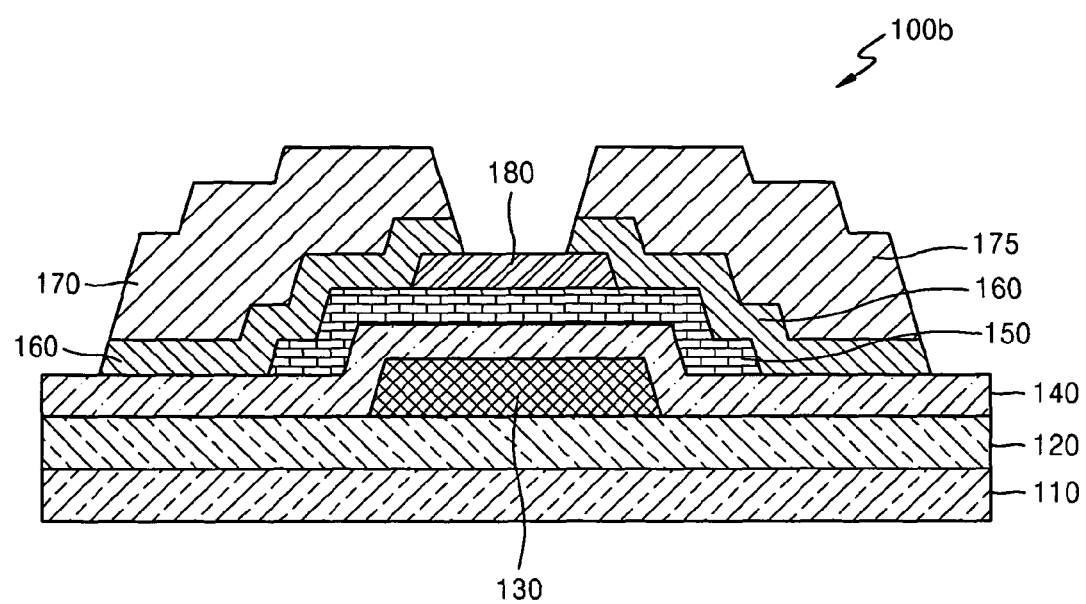
FIG. 3 illustrates a cross-sectional view of a TFT according to a second example embodiment.

FIG. 3 illustrates a cross-sectional view of a TFT 100b according to a second example embodiment.

Referring to FIG. 3, a channel stopper layer 180, i.e., an etch stop layer protecting the channel region, may be further included in the structure shown in FIG. 1. The channel stopper layer 180 may be formed to correspond to, e.g., directly overlie, a channel region of the active layer 150. The channel stopper layer 180 may include a silicon nitride.

Figure 4A:
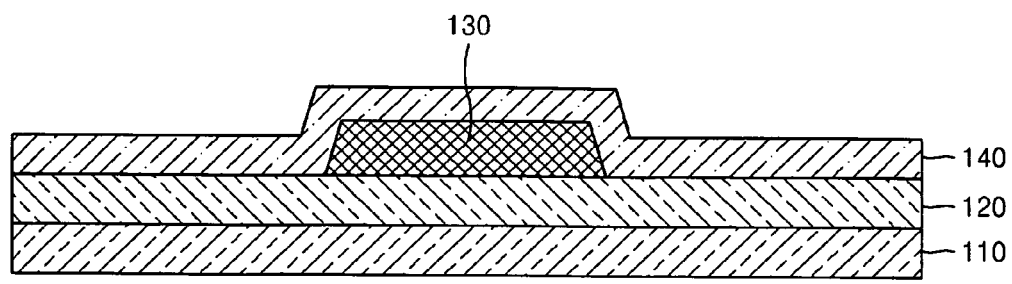
FIGS. 4A through 4C illustrate cross-sectional views of stages in a method of fabricating the TFT of FIG. 3.
Figure 4B:
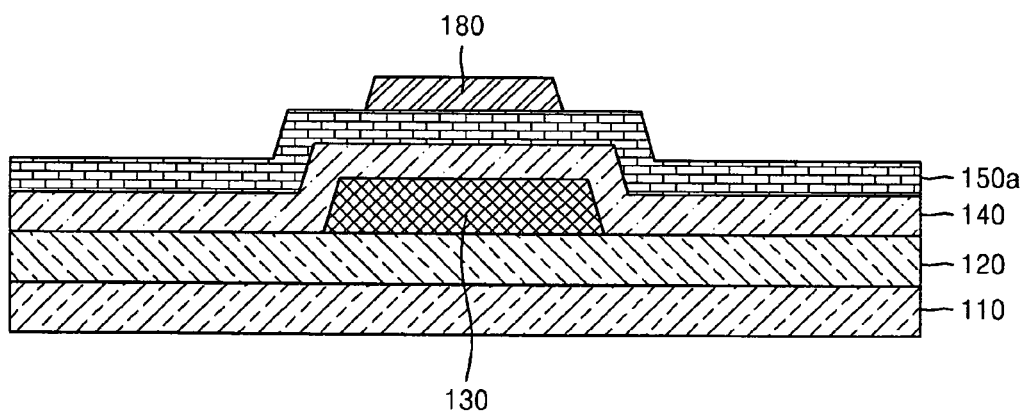
Figure 4C:
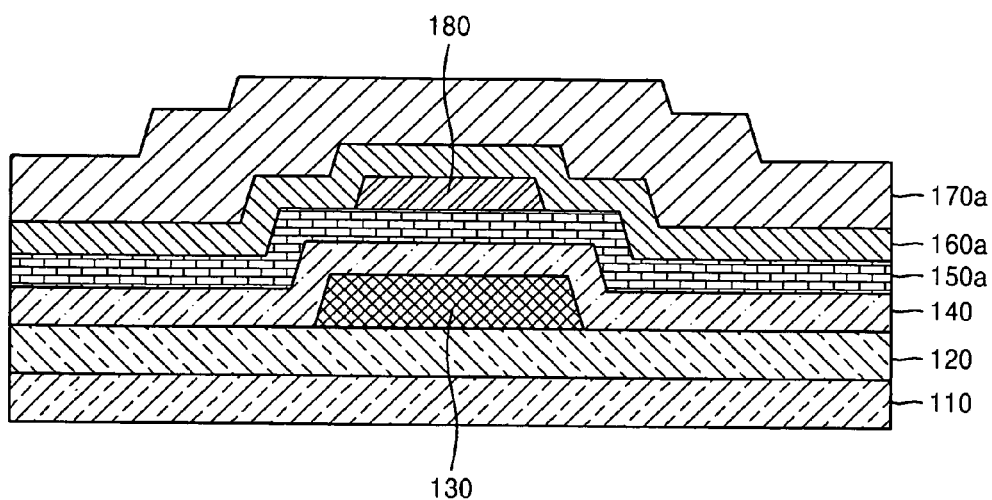

FIGS. 4A through 4C illustrate cross-sectional views of stages in a method of fabricating the TFT 100b of FIG. 3.

Referring to FIG. 4A, the buffer layer 120 may be formed on the substrate 110, and then the gate electrode 130 and the gate insulating layer 140 may be formed on the buffer layer 120 in a manner similar to that described above with reference to FIG. 2A.

Referring to FIG. 4B, the polysilicon layer 150a may be formed on the gate insulating layer 140 by, e.g., a LTPS process. An insulating layer (not shown) may be formed on the polysilicon layer 150a. The insulating layer may include a nitride layer. By etching the insulating layer, the channel stopper layer 180 corresponding to the gate electrode 130 may be formed on the polysilicon layer 150a.

Referring to FIG. 4C, the oxide semiconductor layer 160a may be deposited on the polysilicon layer 150a and on the channel stopper layer 180. The oxide semiconductor layer 160a may be deposited by, e.g., using a sputtering method. A metal layer 170a may be formed on the oxide semiconductor layer 160a.

Next, the metal layer 170a, the oxide semiconductor layer 160a, and the polysilicon layer 150a may be etched while using the channel stopper layer 180 as an etch stop, thereby forming the active layer 150, the ohmic contact layer 160, and the source and drain electrodes 170 and 175 as shown in FIG. 3.

Figure 5:
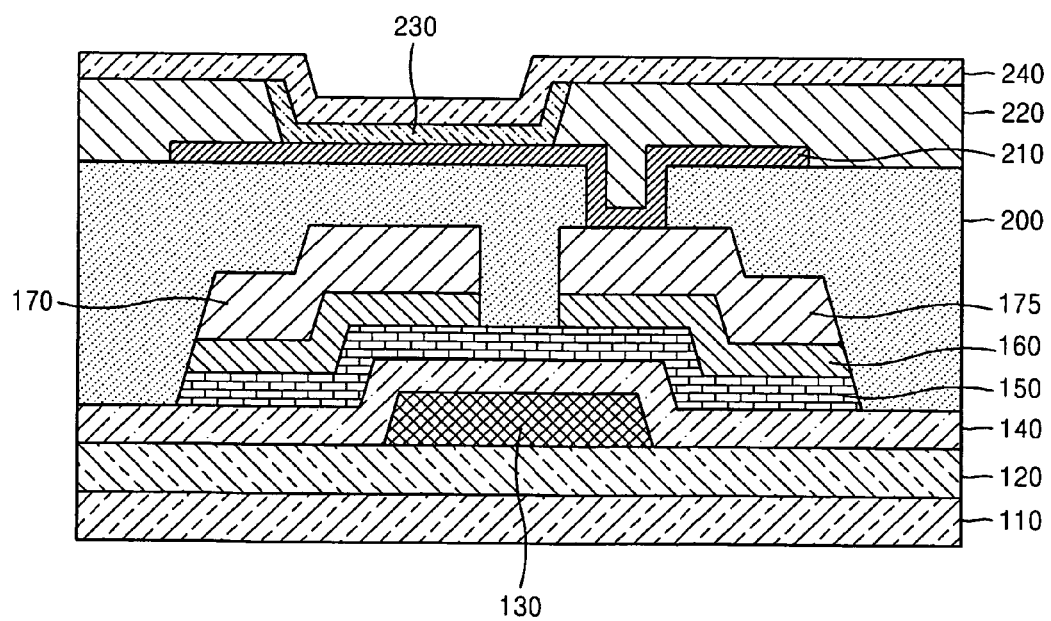
FIG. 5 illustrates a cross-sectional view of an organic light-emitting display apparatus according to a third example embodiment.

FIG. 5 illustrates a cross-sectional view of an organic light-emitting display apparatus according to a third example embodiment.

Referring to FIG. 5, the organic light-emitting display device may include a driving device and an organic light-emitting device. The driving device may be, or may include, the TFT 100a of FIG. 1. The driving device may be, or may include, the TFT 100b of FIG. 3.

The TFT may include the ohmic contact layer 160 formed of an oxide semiconductor layer in regions where the source electrode 170 and the active layer 150 contact each other and where and drain electrode 175 and the active layer 150 contact each other.

A protection layer 200 may be disposed on the substrate 110 and on the driving device. The protection layer 200 may include an organic insulating layer and/or an inorganic insulating layer. The protection layer 200 may have one or more via holes therein, the via hole(s) exposing the source and/or drain electrodes 170 and 175.

A lower electrode 210 for the light emission element may be disposed on the protection layer 200. A pixel defining layer 220 may be disposed on the lower electrode 210. The pixel defining layer 220 may have an opening therein, the opening exposing a portion of the lower electrode 210. An organic light-emitting layer 230 may be arranged at least on the exposed portion of the lower electrode 210. An upper electrode 240 may be disposed on the organic light-emitting layer 230. The upper electrode 240 may be disposed over the whole surface of the substrate 110.

An oxide semiconductor may have the characteristics of a nonconductor or a conductor according to a flow amount of oxygen used during deposition of the oxide semiconductor. Accordingly, a resistance of the ohmic contact layer 160 may be suitably varied by controlling the flow amount of oxygen during formation of the oxide semiconductor layer 160a for the ohmic contact layer 160.

As described above, an oxide semiconductor layer may be used as an ohmic contact layer. Thus, resistance characteristics of the ohmic contact layer may be controlled. In an implementation, a resistance of the ohmic contact layer provided by the oxide semiconductor layer may be controlled to be in a range of several k$\Omega$ (kiloohms) to several thousands of k$\Omega$ according to a flow amount of oxygen.

The ohmic contact layer may be formed using a physical deposition method such as a sputtering method. Lifting between layers may be prevented more effectively when using a physical deposition method than when using a chemical vapor deposition (CVD) method. Accordingly, excellent contact characteristics between the ohmic contact layer and the source and drain electrodes may be obtained while simplifying the manufacturing processes. In contrast, where a doped polysilicon layer, e.g., an N+ type polysilicon layer or a P+ type polysilicon layer, is formed as the ohmic contact layer using a chemical vapor deposition (CVD) method, adhesion force between the layers may be weak due to the non-consecutive CVD deposition process. Thus, lifting between the layers may occur, thereby decreasing the contact characteristics.

Exemplary embodiments have been disclosed herein, and although specific terms are employed, they are used and are to be interpreted in a generic and descriptive sense only and not for purpose of limitation. For example, embodiments may be applied to a bottom-gate TFT, to a top-gate TFT (in which the gate electrode is on top, and the active layer is between the substrate and the gate electrode), etc. Accordingly, it will be understood by those of ordinary skill in the art that various changes in form and details may be made without departing from the spirit and scope of the present invention as set forth in the following claims.

What is claimed is:

1. A method of fabricating a thin film transistor, the method comprising:
    forming a gate electrode on a substrate;
    forming a gate insulating layer on the gate electrode;
    forming an active layer on the gate insulating layer, the active layer corresponding to the gate electrode and including a channel region;
    forming source and drain electrodes on the active layer, the source and drain electrodes being separate from each other; and
    forming an ohmic contact layer between the active layer and at least one of the source and drain electrodes by depositing an oxide semiconductor material on the active layer and by selectively controlling an amount of oxygen flow for the oxide semiconductor material wherein the oxide semiconductor material includes at least one of Ga, Sb, Ge, Hf, and As.

2. The method as claimed in claim 1, wherein forming the ohmic contact layer includes depositing the oxide semiconductor material on the active layer using a sputtering method.

3. The method as claimed in claim 1, wherein the oxide semiconductor material includes at least one of $Ga_2O_3$ and $HfO_2$.

4. The method as claimed in claim 3, wherein the active layer includes polysilicon.

5. The method as claimed in claim 4, wherein forming the active layer includes using a low temperature poly-Si (LTPS) process.

6. The method as claimed in claim 1, further comprising forming a channel stopper layer corresponding to the channel region, such that the channel region is between the channel stopper layer and the gate electrode.

7. The method as claimed in claim 6, wherein the channel stopper layer includes a nitride.

8. The method as claimed in claim 1, wherein selectively controlling the amount of oxygen follow includes using different amounts of oxygen flow relative to a same amount of semiconductor material in accordance with a desired resistance value of the ohmic contact layer.

9. The method as claimed in claim 8, wherein using different amounts of oxygen flow includes forming the oxide semiconductor material as a conductor or as a nonconductor.

10. The method as claimed in claim 1, wherein depositing the oxide semiconductor material includes performing material deposition and oxygen flow control simultaneously, such that only the amount of oxygen flow is changed to modify a ratio between the oxygen and a semiconductor material in the oxide semiconductor material.

11. The method as claimed in claim 1, wherein forming the active layer, source and drain electrodes, and ohmic contact layer is performed simultaneously via a single process using a half-tone mask.

12. The method as claimed in claim 1, wherein forming the source and drain electrodes and the ohmic contact layer includes simultaneously patterning the source and drain electrodes and the ohmic contact layer with a same mask, such that an outermost sidewall of each of the source and drain electrode is coplanar with a respective outermost sidewall of the ohmic contact layer.

13. The method as claimed in claim 1, wherein forming the ohmic contact layer includes patterning the ohmic contact layer, such that the ohmic contact layer completely separates each of the source and drain electrodes from the active layer.

* * * * *